US011211275B2

(12) United States Patent
Ogawa (10) Patent No.: US 11,211,275 B2
(45) Date of Patent: Dec. 28, 2021

(54) SUBSTRATE STORAGE CONTAINER

(71) Applicant: Shin-Etsu Polymer Co., Ltd., Tokyo (JP)

(72) Inventor: Osamu Ogawa, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 41 days.

(21) Appl. No.: 16/628,644

(22) PCT Filed: Jun. 19, 2018

(86) PCT No.: PCT/JP2018/023311
§ 371 (c)(1),
(2) Date: Jan. 3, 2020

(87) PCT Pub. No.: WO2019/009065
PCT Pub. Date: Jan. 10, 2019

(65) Prior Publication Data
US 2020/0185244 A1    Jun. 11, 2020

(30) Foreign Application Priority Data

Jul. 7, 2017 (JP) .............................. JP2017-133708

(51) Int. Cl.
*H01L 21/673* (2006.01)

(52) U.S. Cl.
CPC .. *H01L 21/67373* (2013.01); *H01L 21/67376* (2013.01); *H01L 21/67383* (2013.01)

(58) Field of Classification Search
CPC ......... H01L 21/67373; H01L 21/67376; H01L 21/67383; H01L 21/6735; H01L 21/67; H01L 21/673

USPC ........................................ 206/711; 220/315
See application file for complete search history.

(56) References Cited

U.S. PATENT DOCUMENTS

| 4,347,947 | * | 9/1982 | Hammes ................ | B65D 45/32 |
| | | | | 220/378 |
| 5,469,963 | * | 11/1995 | Bonora ..................... | G03F 1/66 |
| | | | | 206/454 |
| 7,413,099 | * | 8/2008 | Takahashi .............. | B65D 53/02 |
| | | | | 206/710 |

(Continued)

FOREIGN PATENT DOCUMENTS

| JP | 5695857 A | 8/1981 |
| JP | 10245066 A | 9/1998 |

(Continued)

*Primary Examiner* — Rafael A Ortiz
(74) *Attorney, Agent, or Firm* — The Webb Law Firm (57) ABSTRACT

A substrate storage container comprises a container body that stores substrates, a lid that closes an opening of the container body, locking mechanisms provided on the lid and locking with the locking portions of the container body, and packing interposed between the container body and the lid, wherein the packing includes a first packing attached to the container body and a second packing attached to the lid, and wherein the first packing and the second packing are located inside the container body from positions of the locking portions when viewed from the direction orthogonal to the closing direction of the lid. As a result, a substrate storage container with improved internal cleanliness can be provided while also improving the sealability with respect to internal negative pressure and positive pressure.

9 Claims, 7 Drawing Sheets

(56) References Cited

U.S. PATENT DOCUMENTS

| | | | | |
|---|---|---|---|---|
| 7,648,041 | * | 1/2010 | Ueda | H01L 21/67126 |
| | | | | 220/378 |
| 8,292,081 | * | 10/2012 | Sasaki | H01L 21/67376 |
| | | | | 206/710 |
| 8,720,693 | * | 5/2014 | Nagashima | H01L 21/67376 |
| | | | | 206/711 |
| 2002/0005369 | * | 1/2002 | Nyseth | H01L 21/67376 |
| | | | | 206/711 |
| 2002/0195455 | | 12/2002 | Takahashi et al. | |
| 2007/0175792 | * | 8/2007 | Gregerson | H01L 21/67376 |
| | | | | 206/711 |
| 2013/0319907 | * | 12/2013 | Gregerson | H01L 21/67369 |
| | | | | 206/711 |
| 2015/0122699 | * | 5/2015 | Gregerson | F16J 15/104 |
| | | | | 206/711 |

FOREIGN PATENT DOCUMENTS

| JP | 200268364 A | 3/2002 |
|---|---|---|
| JP | 2009302414 A | 12/2009 |
| JP | 20103948 A | 1/2010 |

* cited by examiner

PRIOR ART

FIG. 8B

PRIOR ART

SUBSTRATE STORAGE CONTAINER

CROSS-REFERENCE TO RELATED APPLICATIONS

This application is the United States national phase of International Application No. PCT/JP2018/023311 filed Jun. 19, 2018, and claims priority to Japanese Patent Application No. 2017-133708 filed Jul. 7, 2017, the disclosures of which are hereby incorporated by reference in their entirety.

FIELD

The present invention relates to a substrate storage container for storing substrates.

BACKGROUND OF THE INVENTION

The substrate storage container comprises a container body that stores substrates, a lid that closes an opening of the container body, and annular packing provided between the container body and the lid, wherein the substrates are stored in an airtight state.

In this type of substrate storage container, the packing is provided on at least one of the container body or the lid. For example, in Japanese Patent Application Laid-open Publication No. 2002-068364, if the inside of the substrate storage container is at a negative pressure, in other words, if the external pressure is high, because the extended piece 42 of the packing 40 is deformed in a direction so as to be pressed against the seal surface 12, and the seal portion 43 is in contact with the seal surface 12, good sealability is achieved, and entry of dust from the outside is prevented (see FIGS. 8A and 8B).

On the other hand, in Japanese Patent Application Laid-open Publication No. 2010-003948, the packing is provided on both the container body and the lid, and similarly to Japanese Patent Application Laid-open Publication No. 2002-068364, not only is the entry of dust from the outside prevented, but also the outflow (leakage) of gas from the inside is also prevented.

However, since the two packings described in Japanese Patent Application Laid-open Publication No. 2010-003948 are provided at a position sandwiching locking mechanisms that detachably attach and fix the lid to the container body, if the internal pressure of the substrate storage container becomes negative, then keeping the internal pressure of the substrate storage container constant is difficult because particles generated by the locking mechanism may pass through one packing and move into the substrate storage container

SUMMARY OF THE INVENTION

Therefore, the present invention has been made in view of the above-mentioned problems, and an object thereof is to provide a substrate storage container which improves sealability against internal negative pressure and positive pressure and improves internal cleanliness.

(1) On aspect of the present invention comprises a substrate storage container comprising a container body that stores substrates, a lid that closes an opening of the container body, locking mechanisms provided on the lid and locking with locking portions of the container body, and packing interposed between the container body and the lid, wherein the packing includes a first packing attached to the container body and a second packing attached to the lid, and wherein the first packing and the second packing are located inside the container body from the positions of the locking portions when viewed from a direction orthogonal to a closing direction of the lid.

(2) In the above aspect (1), wherein the container body may be formed so as to have a first attachment groove that attaches the first packing and a second seal surface that contacts the second packing, wherein the lid is formed so as to have a second attachment groove that attaches the second packing and a first seal surface that contacts the first packing, and wherein the first seal surface and the second seal surface are formed by a surface orthogonal to the closing direction of the lid.

(3) In the above aspect (1) or (2), wherein the first packing and the second packing may be arranged so as to be able to overlap each other when viewed from the closing direction of the lid.

(4) In any one of the above aspects (1) to (3), wherein the first packing and the second packing may be formed of the same material.

(5) In any one of the above aspects (1) to (3), wherein the first packing and the second packing may be formed of different materials.

According to the present invention, providing a substrate storage container which improves sealability against internal negative pressure and positive pressure and improves internal cleanliness.

DESCRIPTION OF THE INVENTION

Hereinafter, embodiments of the present invention will be described in detail with reference to the drawings. Note that in the embodiments of the present specification, the same members are denoted by the same reference numerals throughout.

Figure 1:
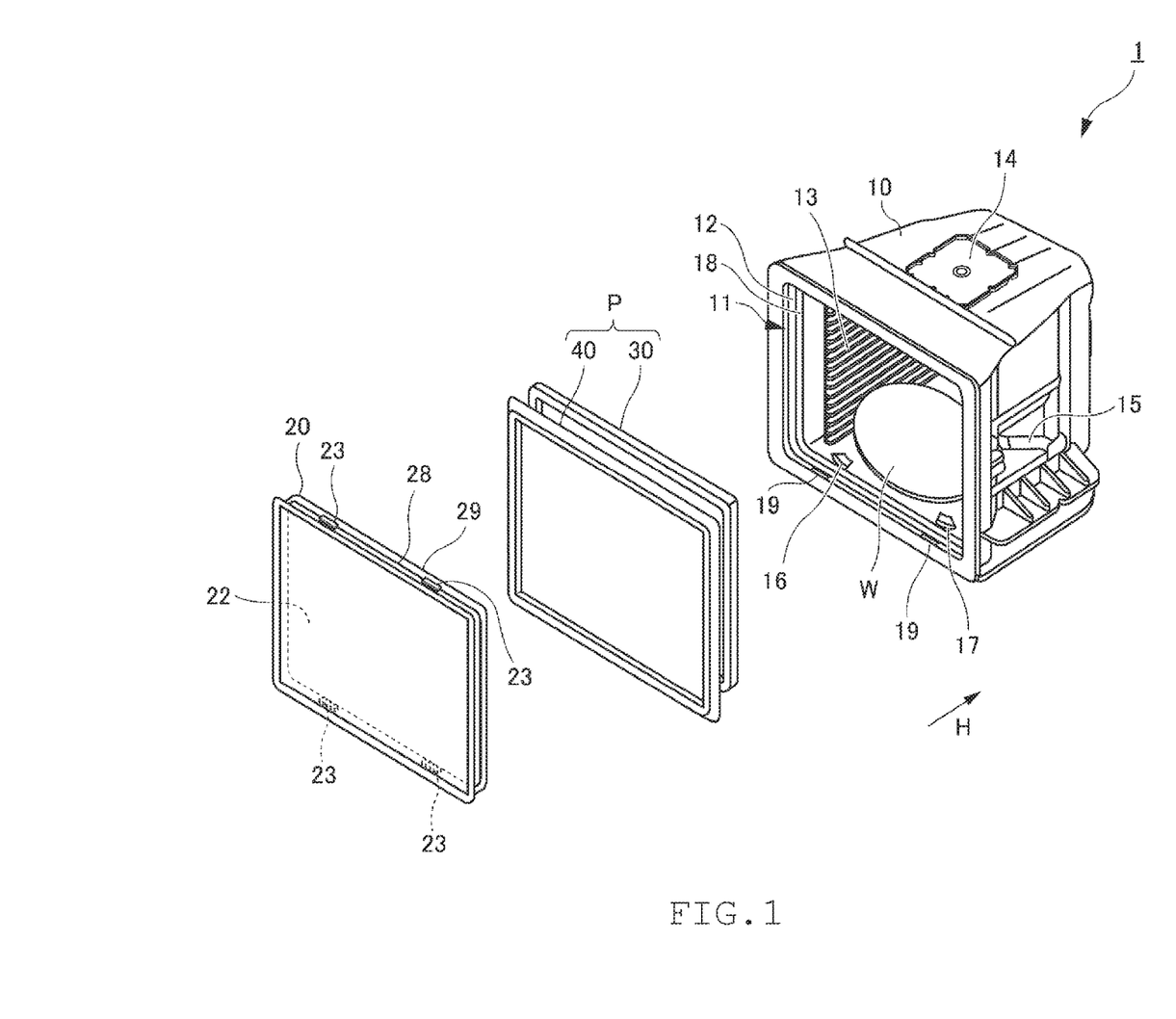
FIG. 1 is an exploded schematic perspective view showing a substrate storage container according to an embodiment of the present invention.

FIG. 1 is an exploded schematic perspective view showing a substrate storage container 1 according to an embodiment of the present invention.

As shown in FIG. 1, the substrate storage container 1 comprises a container body 10 that stores substrates W, a lid 20 that closes an opening 11 of the container body 10, and annular packing P provided (interposed) between the container body 10 and the lid 20. Note that as will be described later, the packing P includes a first packing 30 attached to the container body 10 and a second packing 40 attached to the lid 20.

The container body 10 is a box-like body, and is a front open type in which an opening 11 is formed on the front surface. Note that the container body 10 is preferably a front open type because inserting substrates W having a diameter of 300 mm or 450 mm is easy, but may also be a bottom open type in which the opening 11 is formed on the bottom surface.

Figure 4A:
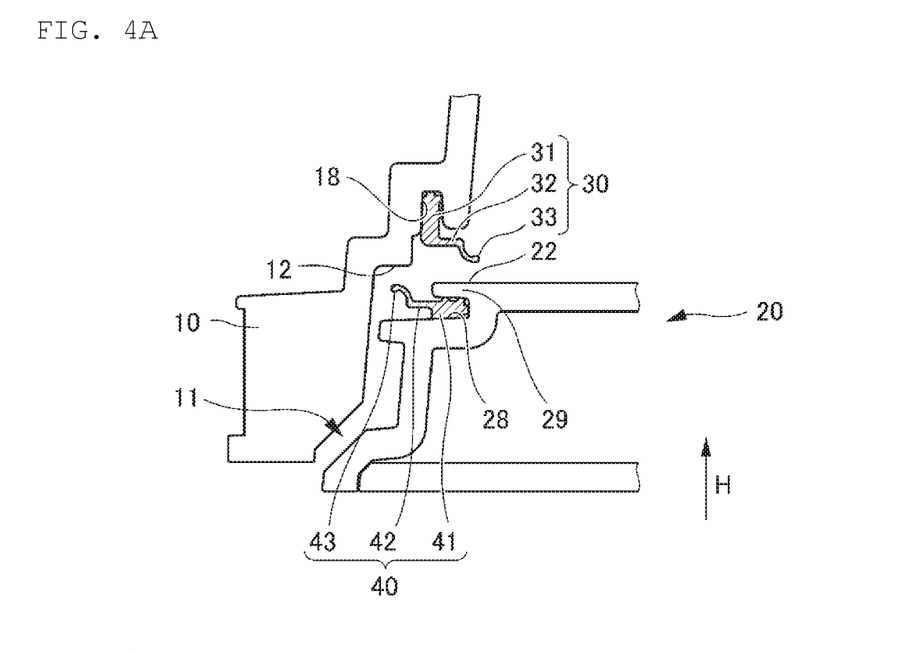
FIG. 4A is an enlarged cross-sectional view in the vicinity of an opening in the substrate storage container of the embodiment showing a state immediately before closing and FIG. 4B is a closed state.
Figure 4B:
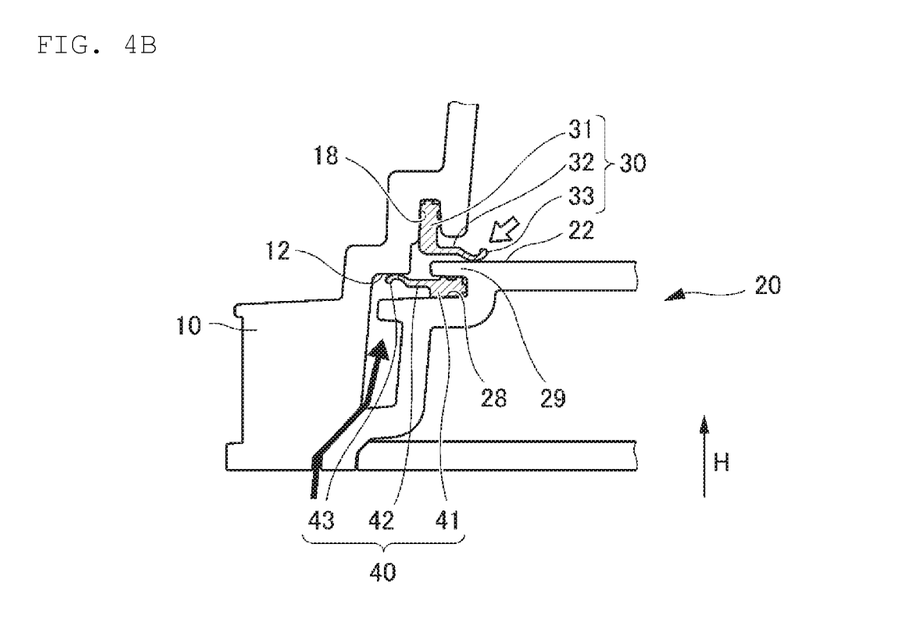

The opening 11 is bent so as to have two level differences so as to spread outward, and the surface of each of the level differences is formed in an annular shape on the inner peripheral edge of the opening 11 as the second seal surface 12 in contact with the second packing 40 (see also FIG. 4). That is, the second seal surface 12 is formed so as to include a surface substantially orthogonal to the closing direction H of the lid 20. Further, a first attachment groove 18 for attaching a first packing 30 is formed in an annular shape having a substantially U-shaped cross section on the inner side of the second seal surface 12.

Also, locking portions 19 are formed at four positions above and below the inner peripheral edge of the opening 11 which are able to be locked to locking mechanisms 23 on the lid 20. These locking portions 19 are locking holes and are located outside the container body 10 from the first attachment groove 18 when viewed from a direction orthogonal to the closing direction H.

Supports 13 are arranged on the left and right sides inside the container body 10. The supports 13 function so as to place and position the substrates W. A plurality of grooves are formed in the supports 13 in the height direction, and constitute so-called groove teeth. Then, the substrates W are placed on two groove teeth on the left and right sides of the same height. The material of the supports 13 may be the same as that of the container body 10, but different materials may also be used to improve cleaning properties and slidability.

Also, rear retainers (not shown) are disposed at the rear (back side) of the interior of the container body 10. If the lid 20 is closed, the rear retainers are paired with front retainers, which will be described later, to hold the substrates W. However, unlike with the present embodiment which has rear retainers, the supports 13 may have, for example, "<"-shaped or linear substrate holders on the back side of the groove teeth so that the substrates W are held by the front retainers and the substrate holders. The supports 13 and the rear retainers are provided on the container body 10 by insert molding, fitting, or the like.

The substrates W are supported by the supports 13 and stored in the container body 10. An example of the substrates W includes silicon wafers, but is not particularly limited, and may be quartz wafers, gallium arsenide wafers, or the like.

A robotic flange 14 is detachably provided at the center of the ceiling of the container body 10. In a clean state, the substrate storage container 1 is held by the robotic flange 14 by a transfer robot in a factory, and is transferred to processing devices for each process for processing the substrates W.

In addition, manual handles 15 that are gripped by an operator are detachably attached to the center portions of the outer surfaces of both side portions of the container body 10.

Then, for example, an air supply unit 16 and an exhaust unit 17 each having a check valve function are provided on the bottom surface of the container body 10. These replace the gas inside the substrate storage container 1 or maintain an airtight state by supplying an inert gas such as nitrogen gas or dry air from the air supply unit 16 to the inside of the substrate storage container 1 which is closed by the lid 20 and discharging the gas from the exhaust unit 17, as necessary. Note that the air supply unit 16 and the exhaust unit 17 are preferably located at positions outside of the positions where they project onto the bottom surface of the substrates W, but the quantities and positions of the air supply unit 16 and the exhaust unit 17 are not limited to those shown in the figures. The air supply unit 16 and the exhaust unit 17 each have a filter for filtering gas.

The replacement of the internal gas is performed for the purpose of blowing off the impurities on the stored substrates W or lowering the internal humidity, and performed so as to maintain the cleanliness of the inside of the substrate storage container 1 during transport. Then, by detecting the gas on the side of the exhaust unit 17, confirming whether or not the replacement of the gas has been reliably performed is possible. Also, when the internal gas is replaced or when the lid 20 is attached to the container body 10 and is closed, the internal pressure of the substrate storage container 1 becomes positive, or conversely, when the lid 20 is removed from the container body 10, the internal pressure of the substrate storage container 1 becomes negative.

On the other hand, the lid 20 has a substantially rectangular shape that is attached to the front surface of the opening 11 of the container body 10. Also, one portion of the surface of the lid 20 is formed as a first seal surface 22 in contact with the first packing 30. That is, the first seal surface 22 is formed so as to include a surface substantially orthogonal to the closing direction H of the lid 20. Furthermore, the elastic front retainers (not shown) which hold the front peripheral edges of the substrates W horizontally are detachably attached or integrally formed on the central portion of the lid 20 on the first seal surface 22 side.

Since the front retainers are portions that are in direct contact with the substrates W, just like with the groove teeth and the substrate holders of the supports 13, materials with good cleaning properties and slidability are used. The front retainer can also be provided on the lid 20 by insert molding, fitting, or the like.

Then, a second attachment groove 28 for attaching the second packing 40 is formed in the lid 20 (see also FIG. 4). More specifically, a convex portion 29 smaller than the level difference portions of the opening 11 is formed in an annular shape on the surface of the lid 20 on the container body 10 side, so that the attachment groove 28 is formed in an annular shape with a substantially U-shaped cross section. When the lid 20 is attached to the container body 10, the convex portion 29 enters deeper than the level difference portion of the opening 11.

Also, the locking mechanisms 23 which lock the lid 20 to the container body 10 are provided at four locations above and below the lid 20. The locking mechanisms 23 each have a locking claw 24 that can be moved into and out of each locking portion 19, and when locking the lid 20 to the container body 10, by locking each locking claw 24 in each locking portion 19, the lid 20 is configured so as to be able to be locked while being pressed against the container body 10 via the first packing 30 and the second packing 40. Note that the locking mechanisms 23 are located outside the second attachment groove 28 when viewed from the direction orthogonal to the closing direction H.

Examples of the material of the container body 10 and the lid 20 include thermoplastic resins such as polycarbonates, cycloolefin polymers, polyetherimides, polyether sulfones, polyether ether ketones, liquid crystal polymers, or the like. The thermoplastic resins may further include, as appropriate, a conductive agent made of conductive carbon, conductive fiber, metallic fiber, conductive polymer, or the like, various antistatic agents, ultraviolet absorbers, or the like.

Figures 2A, 2B:
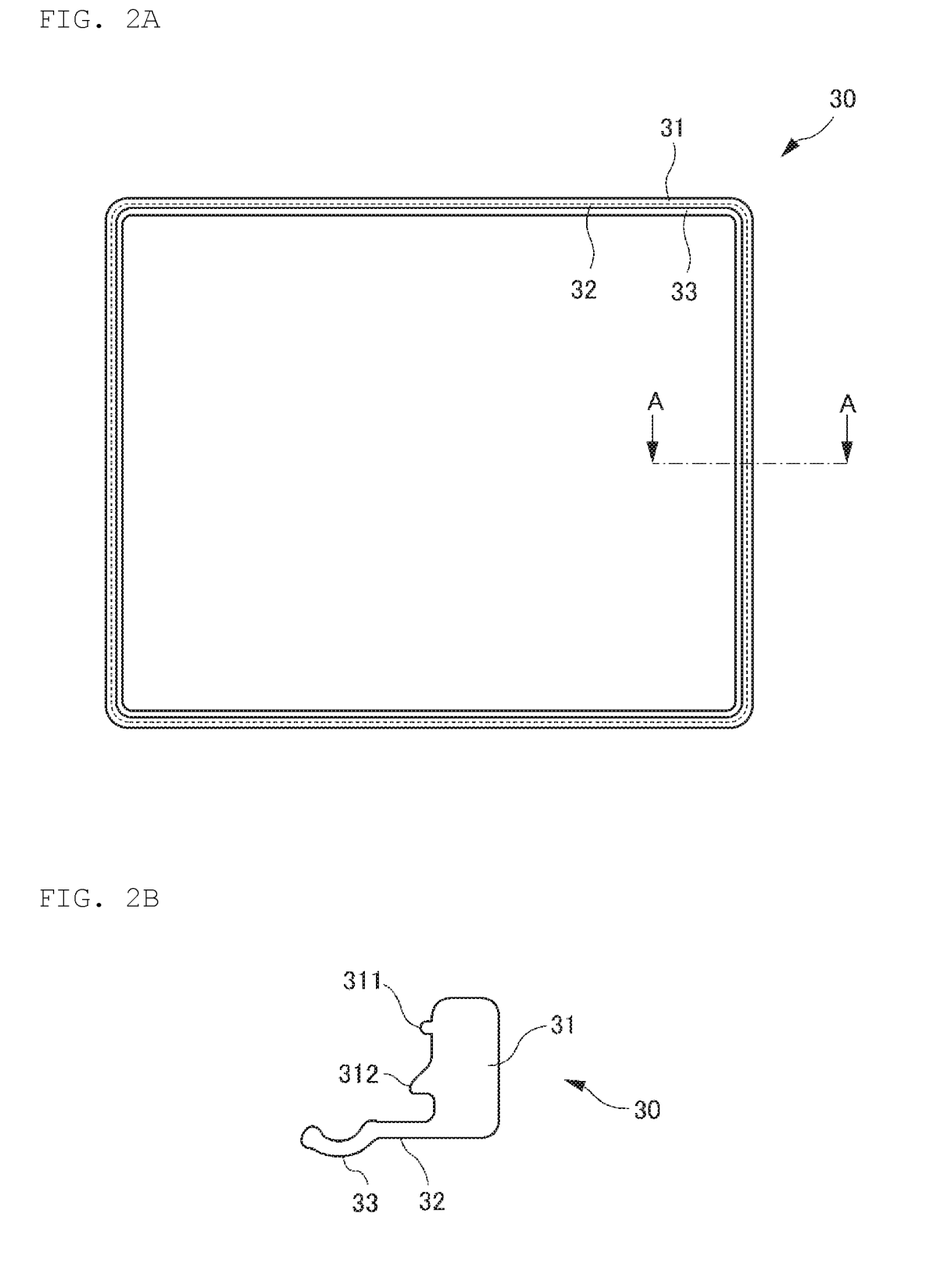
FIG. 2A is a rear view of the first packing.
FIG. 2B is a cross-sectional view taken along line AA.
Figure 3A:
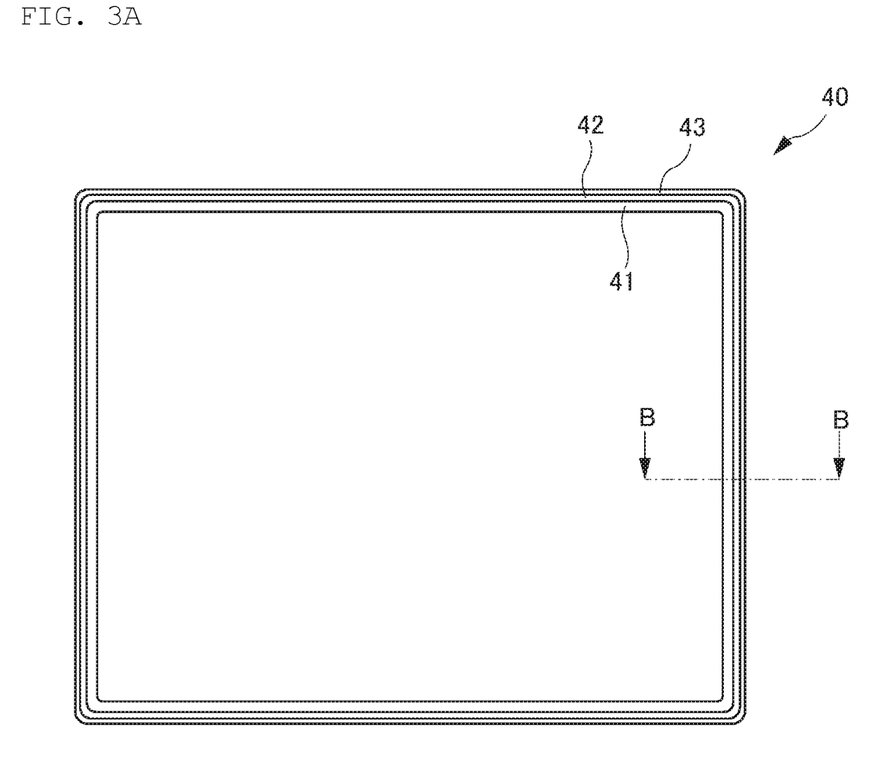
FIG. 3A is a rear view of the second packing.
Figure 3B:
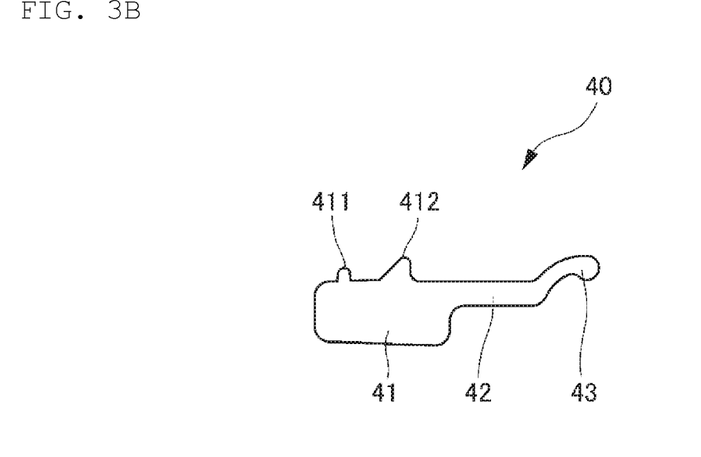
FIG. 3B is a cross-sectional view taken along the line BB.

Next, the first packing 30 and the second packing 40 will be described. FIG. 2A is a rear view of the first packing 30, and FIG. 2B is a cross-sectional view taken along line AA. FIG. 3A is a rear view of the second packing 40, and FIG. 3B is a cross-sectional view taken along the line BB.

The first packing 30 and the second packing 40 have a rectangular frame shape corresponding to the respective shape of either the opening 11 of the cover body 20 or the container body 10, as shown to FIG. 2 (*a*) and FIG. 3 (*a*), but for example, an annular shape may also be used.

The first packing 30 is formed of a first main body 31 fitted in the first attachment groove 18, a first extended piece 32 extending from the first main body 31, and a first seal portion located beyond the end of the first extended piece 32 and extends outward while curving.

The first main body 31 is formed so as to have the same frame shape as the first attachment groove 18, and is formed in a substantially rectangular shape so that a cross-section thereof substantially corresponds to the cross-sectional shape of the first attachment groove 18. Also, the first main body 31 is formed with a first fitting protrusion 311 and a second fitting protrusion 312 with each formed in a tapered manner; furthermore, the first fitting protrusion 311 is formed at a position corresponding to the back side of the first attachment groove 18, and the second fitting protrusion 312 is formed at a position corresponding to the opening side of the first attachment groove 18.

The first extended piece 32 extends toward the inside of the rectangular frame so as to be substantially perpendicular to the first main body 31. However, when the lid 20 is attached to the container body 10, the first extended piece 32 may also extend from the first main body 31 at an angle other than a right angle so long as the first seal portion 33 reliably contacts the first seal surface 22.

The first seal portion 33 stretches while curving in a convex manner toward the lid 20 (see also FIG. 4). The thickness of the first seal portion 33 is preferably about 0.6 mm, but is not particularly limited so long as there are no problems with molding.

On the other hand, the second packing 40 is formed of a second main body 41 fitted in the second attachment groove 28, a second extended piece 42 extending from the second body 41, and a second seal portion 43 located beyond the end of the first extended piece 42 and extends outward while curving.

The second main body 41 is formed so as to have the same frame shape as the second attachment groove 28, and is formed in a substantially rectangular shape so that a cross-section thereof substantially corresponds to the cross-sectional shape of the second attachment groove 28. Also, the second main body 41 is formed with a first fitting protrusion 411 and a second fitting protrusion 412 with each formed in a tapered manner; furthermore, the first fitting protrusion 411 is formed at a position corresponding to the back side of the second attachment groove 28, and the second fitting protrusion 412 is formed at a position corresponding to the opening side of the second attachment groove 28.

The second extended piece 42 extends toward the inside of the rectangular frame so as to be substantially perpendicular to the second main body 41. However, when the lid 20 is attached to the container body 10, the second extended piece 42 may also extend outward in a state not parallel to the second main body 41 so long as the second seal portion 43 reliably contacts the second seal surface 12.

The second seal portion 43 stretches while curving in a convex manner toward the lid 20 (see also FIG. 4). The thickness of the second seal portion 43 is preferably about 0.6 mm, but is not particularly limited so long as there are no problems with molding.

Incidentally, when the first packing 30 and the second packing 40 are loosened when fitted in and attached to the first attachment groove 18 and the second attachment groove 28, variations occur in the heights of the first seal portion 33 and the second seal portion 43, for this reason, the inner peripheral side of the first main body 31 is formed to be slightly smaller (about 1% to 5%) than the annular peripheral surface inside the first attachment groove 18, and the inner peripheral side of the second main body 41 is formed to be slightly smaller (about 1% to 5%) than the annular peripheral surface at the bottom of the second attachment groove 28.

With respect to the material for the first packing 30 and the second packing 40, elastic bodies such as thermoplastic elastomers including polyester elastomers, polyolefin elastomers, fluorine elastomers, urethane elastomers, or the like, fluororubber, ethylene propylene rubber, silicone rubber or the like can be used. From the viewpoint of improving adhesion, a predetermined amount of fillers made of carbon, glass fiber, mica, talc, silica, calcium carbonate, or the like, and resins such as polyethylene, polyamide, polyacetal, fluorine-based resin, silicone resin, or the like may be selectively added to these materials. In addition, from the viewpoint of imparting conductivity and/or antistatic properties, carbon fibers, metal fibers, metal oxides, various antistatic agents, or the like may be added as appropriate. Note that the hardness of the first packing 30 and second packing 40 is preferably 40 to 90 on the Shore A hardness scale, and more preferably 60 to 90.

Moreover, the first packing 30 and the second packing 40 may be formed of the same material or different materials. When the first packing 30 and the second packing 40 are formed of the same material, the sealability of the packing P can be improved by about a factor of two. On the other hand, when the first packing 30 and the second packing 40 are formed of different materials, the function of the packing P can be improved by utilizing the characteristics of each material.

Table 1 shows examples of materials.

TABLE 1

| | | Moisture Permeability | Sticki-ness | Clean-liness | Unit Price | Molding Method |
|---|---|---|---|---|---|---|
| Flurorubbers | | Excellent | Good | Excellent | High | Press Molding |
| Elastomers | Olefin, Styrine | Excellent | Excellent | Good | High | Injection Molding |
| | Polyester | Bad | Excellent | Excellent | Low | Injection Molding |

For example, when the second packing 40 is made of a fluororubber, even if the first packing 30 is made of a polyester elastomer that has poor moisture permeability, the packing P does not allow moisture to permeate therethrough, and sealability can be improved.

Also, when using an olefin-based or styrene-based elastomer for the second packing 40, even if a polyester elastomer is used for the first packing 30, with respect to the packing P, although the degree of cleanliness inside the substrate container 1 may deteriorate somewhat within a range in which no problem occurs, the sealability can be improved without allowing moisture to permeate.

Finally, effects on the substrate storage container 1 according to embodiments of the present invention will be described.

Figure 8A:
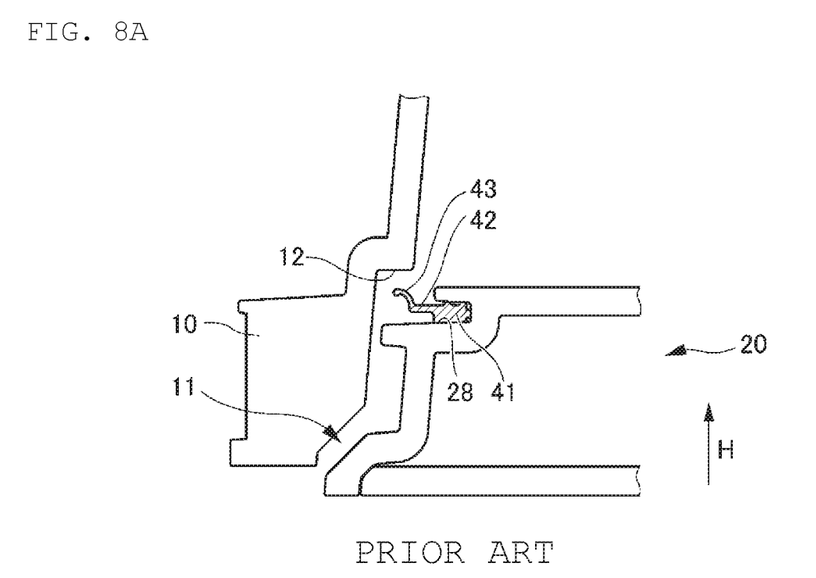
FIG. 8A is an enlarged cross-sectional view in the vicinity of an opening in a conventional substrate storage container showing a state immediately before closing and FIG. 8B a closed state.
Figure 8B:
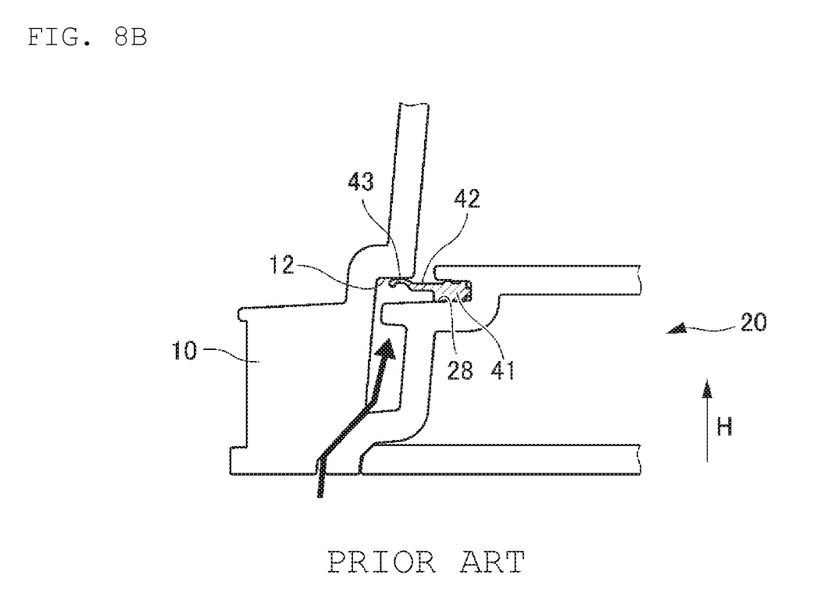

FIG. 4A is an enlarged cross-sectional view in the vicinity of the opening 11 in the substrate storage container 1 of an embodiment showing a state immediately before closing and FIG. 4B is a closed state. FIG. 8A is an enlarged cross-sectional view in the vicinity of the opening 11 in a conventional substrate storage container 1 showing a state immediately before closing and FIG. 8B is a closed state. Note that the white arrow indicates the gas flow when the inside of the substrate storage container 1 is at a positive pressure, and the solid line arrow indicates the gas flow when the inside is at a negative pressure.

As shown in FIG. 4A, the lid 20 is attached so as to be able to close the opening 11 of the container body 10; moreover, when in the state shown in FIG. 4B, the first seal portion 33 of the first packing 30 contacts the first seal surface 22 of the lid 20, and the first seal portion 33 is pressed against the first seal surface 22 while being deformed together with the first extended piece 32. On the other hand, the second seal portion 43 of the second packing 40 contacts the second seal surface 12 of the container body 10, and the second seal portion 43 is pressed against the second seal surface 12 while being deformed together with the second extended piece 42.

As described above, along with the first seal portion 33 of the first packing 30 being in contact with the first seal surface 22, the second seal portion 43 of the second packing 40 is in contact with the second seal surface 12 outside the first seal surface 22 with which the first seal portion 33 makes contact. At this time, the first packing 30 and the second packing 40 are disposed so as to overlap each other when viewed from the closing direction H of the lid 20.

For this reason, when the inside of the substrate storage container 1 becomes a positive pressure, because the first seal portion 33 of the first packing 30 is further pressed against the first seal surface 22 and comes into close contact, gas leakage from the inside can be reduced.

On the other hand, when the inside of the substrate storage container 1 becomes negative pressure, because the second seal portion 43 of the second packing 40 is further pressed against the second seal surface 12 and comes into close contact, intrusion of dust, moisture or the like from the outside can be reduced.

In other words, even if the inside of the substrate storage container 1 becomes a positive pressure or a negative pressure, the sealability of the substrate storage container 1 (between the container body 10 and the lid 20) can be maintained.

Furthermore, since the first seal portion 33 and the second seal portion 43 are displaced along the closing direction H of the lid 20 and contact the first seal surface 22 or the second seal surface 12, respectively, the first seal portion 33 and the second seal portion 43 do not substantially move in the direction substantially orthogonal to the closing direction H, and generation of particles due to the first packing 30 and the second packing 40 sliding on the first seal surface 22 or the second seal surface 12 can be reduced.

As described above, the substrate storage container 1 of the embodiment according to the present invention is a substrate storage container 1 comprising a container body 10 that stores substrates W, a lid 20 that closes the opening 11 of the container body 10, locking mechanisms 23 provided on the lid 20 and locking with the locking portions 19 of the container body 10, and packing P interposed between the container body 10 and the lid 20, wherein the packing P includes a first packing 30 attached to the container body 10 and a second packing 40 attached to the lid 20, and wherein the first packing 30 and the second packing 40 are located inside the container body 10 from the position of the locking portions 19 when viewed from the direction orthogonal to the closing direction H of the lid 20.

According to the embodiment, with respect to a positive pressure inside the substrate storage container 1, the first seal portion 33 is in close contact with the first seal surface 22 to ensure the airtightness of the substrate storage container 1, and gas leakage from the inside can be reduced. On the other hand, with respect to a negative pressure inside the substrate storage container 1, the second seal portion 43 is in close contact with the second seal surface 12 to ensure the airtightness of the substrate storage container 1, and intrusion of dust, moisture, or the like from the outside can be reduced.

Moreover, even if the internal pressure of the substrate storage container 1 becomes a negative pressure, since particles generated by the locking mechanism 23 are prevented from passing by the second packing 40, the cleanliness inside the substrate storage container 1 can be maintained.

Further, since the packing P includes both the first packing 30 and the second packing 40, by combining the characteristics of each material, the functions of the packing P, e.g. the sealability and cleanliness against positive or negative pressures, such as sealability of the contact surface of the packing P, low moisture permeability, or the like can be improved.

Although the preferred embodiments of the present invention have been described above in detail, the present invention is not limited to the embodiments described above, and various modifications and changes can be made within the scope of the gist of the present invention described in the claims.

(Modifications)

Figure 5:
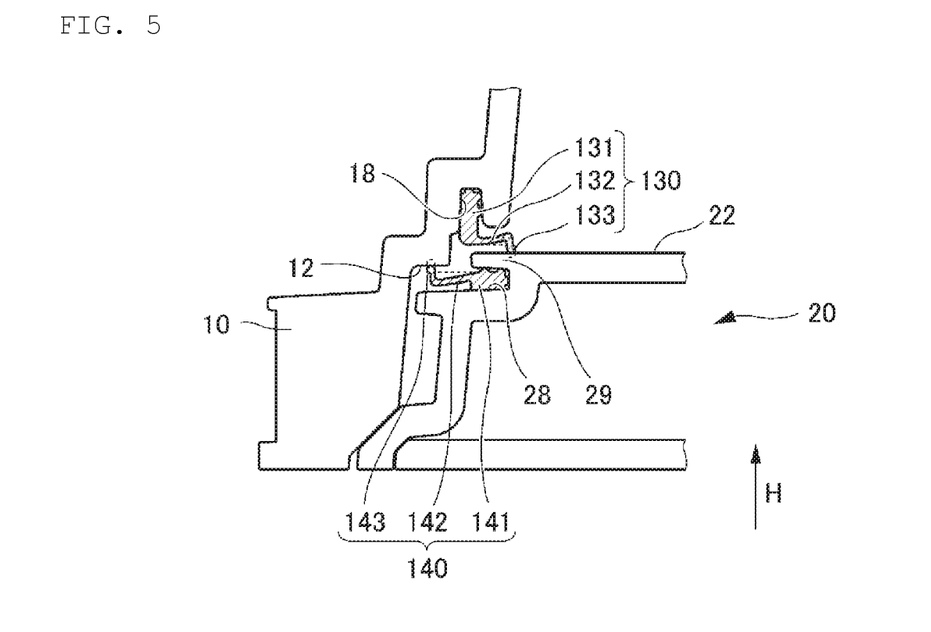
FIG. 5 is an enlarged cross-sectional view showing a closed state in the vicinity of the opening in the substrate storage container of a first modification.
Figure 6:
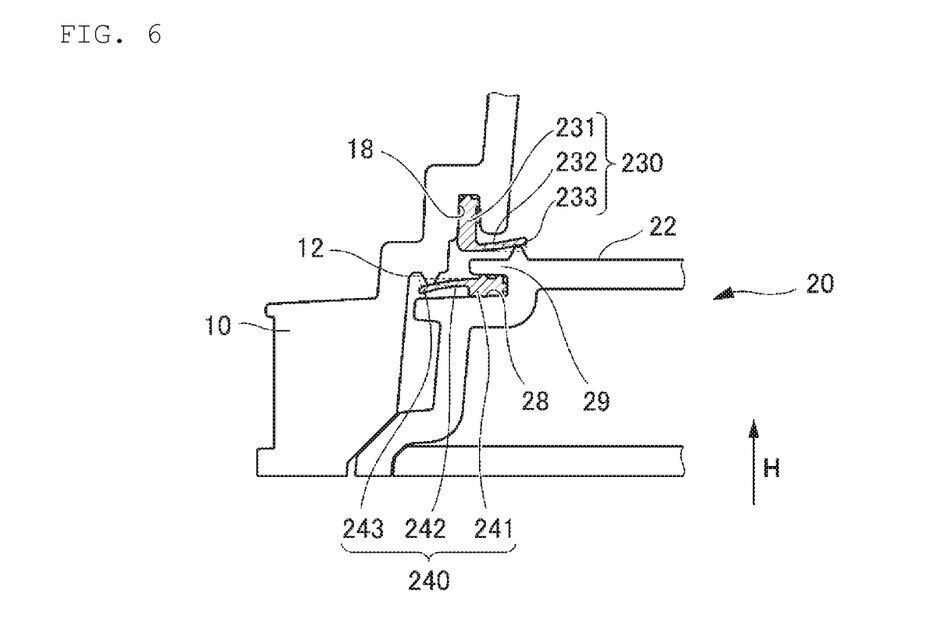
FIG. 6 is an enlarged cross-sectional view showing a closed state in the vicinity of the opening in the substrate storage container of a second modification.
Figure 7:
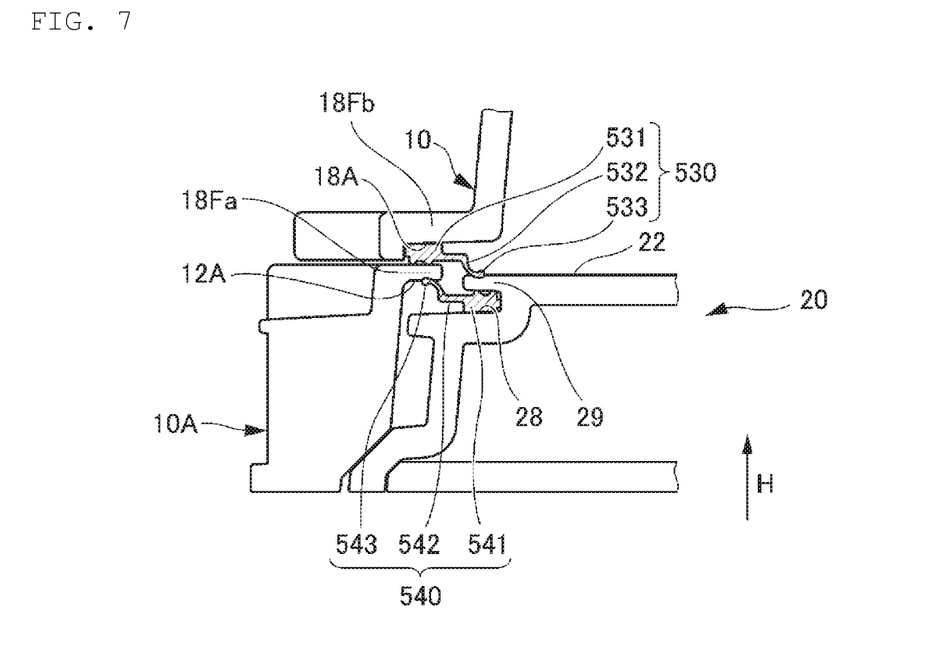
FIG. 7 is an enlarged cross-sectional view showing a closed state in the vicinity of the opening in the substrate storage container of a third modification x.

Here, various modifications from a first to a third will be described; FIG. 5 is an enlarged cross-sectional view showing a closed state in the vicinity of the opening in the substrate storage container 1 of a first modification. FIG. 6 is an enlarged cross-sectional view showing a closed state in the vicinity of the opening in the substrate storage container 1 of a second modification. FIG. 7 is an enlarged cross-sectional view showing a closed state in the vicinity of the opening in the substrate storage container 1 of a third modification.

In the substrate storage container 1 of the first modification, the first extended piece 132 and the first seal portion 133 of the first packing 130 and the second extended piece 142 and the second seal portion 143 of the second packing 140 are different from the first packing 30 and the second packing 40 of the above embodiment.

The first extended piece 132 extends inward in a rectangular frame shape so as to be substantially perpendicular to a first main body 131, and a first seal portion 133 is formed beyond the end bent at a substantially right angle (i.e., the closing direction H) toward the lid 20 (see FIG. 5). Also, a second extended piece 142 extends outward substantially in parallel with a second main body 141, and a second seal portion 143 is formed beyond the end bent at a substantially right angle (i.e., in the closing direction H) toward the lid 20.

In the substrate storage container 1 of the first modification, the first seal portion 133 and the second seal portion 143 are respectively displaced along the closing direction H of the lid 20, and since the first seal surface 22 or the second seal surface 12 is contacted, the first seal portion 133 and the second seal portion 143 do not substantially move in a direction substantially orthogonal to the closing direction H. Therefore, generation of particles can be reduced from the first packing 130 and the second packing 140 sliding on the first seal surface 22 or the second seal surface 12.

Next, in the substrate storage container 1 of the second modification, a first extended piece 232 and a first seal portion 233 of a first packing 230 and a second extended piece 242 and a second seal portion 243 of a second packing 240 are different from each other with respect to the first packing 30 and the second packing 40 of the above embodiments, and furthermore, a first seal surface 22 and a second seal surface 12 are each formed at the tip of a protrusion.

The first extended piece 232 extends inward in a rectangular frame shape so as to form a substantially right angle with the first main body 231, and the first seal portion 233 that contacts the first seal surface 22 is formed at the end of the first extended piece 232 (see FIG. 6). Further, the second extended piece 242 extends outward substantially in parallel with the second main body 241, and the second seal portion 243 that contacts the second seal surface 12 is formed at the end of the second extended piece 242.

Even in the substrate storage container 1 of the second modification, the first seal portion 233 and the second seal portion 243 are respectively displaced along the closing direction H of the lid 20, and since the first seal surface 22 or the second seal surface 12 is contacted, the first seal portion 233 and the second seal portion 243 do not substantially move in a direction substantially orthogonal to the closing direction H. Therefore, the generation of particles due to sliding of the first packing 230 and the second packing 240 on the first seal surface 22 or the second seal surface 12 can be reduced.

Finally, the substrate storage container 1 of the third modification differs from the above embodiments in that the first packing 530 is attached to the first attachment groove 18 formed in a direction substantially orthogonal to the closing direction H of the lid 20

The container body 10 of the third modification has a frame-shaped door flange 10A that forms the opening 11 as a separate member, and a first attachment groove 18A is formed between the container body 10 and the door flange 10A. Specifically, a flange portion 18Fb which is partially recessed is formed on the front side of the container body 10, and a flange portion 18Fa is formed on the back side of the door flange 10A. The front side of the flange portion 18Fa of the door flange 10A is formed as a second seal surface 12A. Note that the container body 10 and the door flange 10A are coupled and fixed by some kind of fitting means, locking means, fixing means, or the like (not shown).

The first packing 530 is attached to the first attachment groove 18A formed between the flange portions 18Fa and 18Fb, and also acts as a seal between the container body 10 and the door flange 10A.

In the substrate storage container 1 of the third modification, the two packings P can be arranged in a narrower region in the closing direction H as compared with the above embodiments.

In addition, in the above embodiments or the like, the second seal surface 12 and the first seal surface 22 may be subjected to a scribing process in order to prevent the first packing 30 and the second packing 40 from sticking to each other.

The invention claimed is:

1. A substrate storage container comprising:
   a container body that stores substrates,
   a lid that closes an opening of the container body,
   locking mechanisms provided on the lid and locking with locking portions of the container body, and
   packing interposed between the container body and the lid,
   wherein the packing includes a first packing attached to the container body and a second packing attached to the lid;
   wherein the first packing has a first main body fitted in a first attachment groove with a frame-like shape formed in the container body, a first extended piece extending from the first main body toward an inside of the frame-like shape formed in the container body, and a first seal portion located beyond an end of the first extended piece and extending while curving such that the first seal portion is able to contact a seal surface on the lid orthogonal to a closing direction of the lid;
   wherein the second packing has a second main body fitted in a second attachment groove with a frame-like shape formed in the lid, a second extended piece extending from the second main body outward of the frame-like shape formed in the lid, and a second seal portion located beyond an end of the second extended piece and extending while curving such that the second seal portion is able to contact a seal surface on the container body orthogonal to the closing direction of the lid;
   wherein the first packing and the second packing are arranged so as to be able to overlap each other when viewed from the closing direction of the lid; and
   wherein the first packing and the second packing are located inside the container body from positions of the locking portions when viewed from a direction orthogonal to the closing direction of the lid.

2. The substrate storage container according to claim 1, wherein the first packing and the second packing are formed of the same material which is selected from a group composed of polyester elastomers, polyolefin elastomers, fluorine elastomers, urethane elastomers, fluororubber, ethylene propylene rubber, and silicone rubber.

3. The substrate storage container according to claim 1, wherein the first packing and the second packing are formed of different materials which is selected from a group composed of polyester elastomers, polyolefin elastomers, fluorine elastomers, urethane elastomers, fluororubber, ethylene propylene rubber, and silicone rubber.

4. The substrate storage container according to claim 1, wherein the first extended piece extends substantially perpendicular to the first main body.

5. The substrate storage container according to claim 1, wherein the first seal portion extends in a convex manner toward the lid.

6. The substrate storage container according to claim 1, wherein the second extended piece and the second main body extend substantially on the same plane.

7. The substrate storage container according to claim 1, wherein the second seal portion extends in a convex manner toward the container body.

8. The substrate storage container according to claim 1, wherein the first attachment groove has a substantially U-shaped cross section opening substantially along the closing direction of the lid.

9. The substrate storage container according to claim 1, wherein the second attachment groove has a substantially U-shaped cross section opening along a direction substantially perpendicular to the closing direction of the lid.

* * * * *